United States Patent [19]
Shim et al.

[11] Patent Number: 5,877,988
[45] Date of Patent: Mar. 2, 1999

[54] READ/WRITE CONTROL CIRCUIT FOR SEMICONDUCTOR MEMORY DEVICE

[75] Inventors: Jae Kwang Shim; Sang Ho Lee, both of Choongcheongbuk-Do, Rep. of Korea

[73] Assignee: LG Semicon Co., Ltd., Cheongju, Rep. of Korea

[21] Appl. No.: 901,433

[22] Filed: Jul. 25, 1997

[30] Foreign Application Priority Data

Jul. 26, 1996 [KR] Rep. of Korea .................. 1996 30585

[51] Int. Cl.⁶ .................................................. G11C 16/04
[52] U.S. Cl. .............................. 365/189.05; 365/189.04; 365/189.07; 365/233
[58] Field of Search ......................... 365/189.05, 189.07, 365/233, 189.01, 189.03, 194, 189.04

[56] References Cited

U.S. PATENT DOCUMENTS

| | | | |
|---|---|---|---|
| 4,712,197 | 12/1987 | Sood | 365/233 |
| 5,701,275 | 12/1997 | McClure | 365/233 |
| 5,708,608 | 1/1998 | Park et al. | 365/189.05 |

*Primary Examiner*—David Nelms
*Assistant Examiner*—David Lam
*Attorney, Agent, or Firm*—Fleshner & Kim

[57] ABSTRACT

A write error preventing circuit for a semiconductor memory device prevents an erroneous reading operation an input buffer compares an externally applied write enable signal to an effective level signal, which is preset therein. A write error preventive circuit outputs a disable signal to the input buffer during an interval of time when a ground voltage bounces in accordance with an internal output signal from a NAND gate of an output buffer. The circuit prevents the outputting of a write signal from the input buffer during a read operation in accordance with the internal output signal from the output buffer when the ground voltage bounces.

17 Claims, 5 Drawing Sheets

RAS

CAS

WE

D/$\overline{D}$

DQ

Vss

FIG.5A RAS
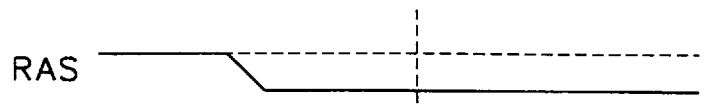
FIG.5B CAS
FIG.5C WE
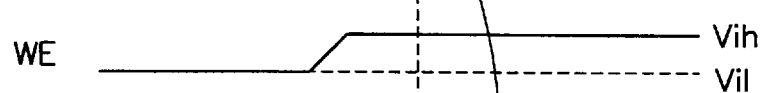
FIG.5D D/D̄
FIG.5E PD
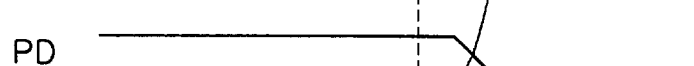
FIG.5F DQi
FIG.5G Vss
FIG.5H DIS
FIG.5I EFFECTIVE INPUT LEVEL
FIG.5J WEi
FIG.5K W
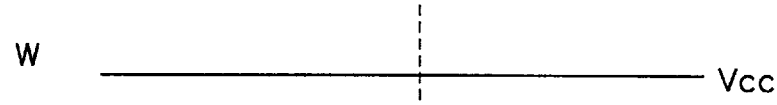

READ/WRITE CONTROL CIRCUIT FOR SEMICONDUCTOR MEMORY DEVICE

BACKGROUND OF THE INVENTION

1. Field of the Invention

The present invention relates to a read/write apparatus for a semiconductor memory device, and more particularly, a read/write control circuit for stabilizing a data write operation.

2. Background of the Related Art

FIG. 1 is a read/write control circuit of a conventional semiconductor memory device. An input buffer 11 compares an externally applied write enable signal WE to a valid signal level, which is preset therein. A write timing generator 12 receives the output signal from the input buffer through an inverter I1 and outputs a write signal. A read timing generator 13 generates a read timing signal in accordance with a row address strobe signal RAS and a column address strobe signal CAS, and outputs a chip enable signal CE in accordance with an output enable signal. An output buffer 14 receives the chip enable signal CE and externally outputs data D and /D applied thereto from the semiconductor memory device in accordance with the chip enable signal CE.

The input buffer 11 includes pull-up transistor PM1 and pull-down transistor NM1 and serves as an inverter to compare the level of the write enable signal WE to a preset threshold voltage Vth (0.8<Vth<2.4 in case of TTL input buffer). When the write enable signal WE has a level lower than the threshold voltage level, the input buffer 11 outputs a high output signal. When the write enable signal WE has a level higher than the threshold voltage level, the input buffer 11 outputs a low output signal.

During a write operation of a semiconductor memory device, the write enable signal WE of a prescribed low level Vil is generated, as shown in the beginning portion of FIG. 2C, such that the input buffer 11 outputs a high signal, which is inverted to a low level signal by the inverter I1. The low signal is applied to the write timing generator 12 to output a write signal W, which is transmitted to an internal circuit, thereby writing data in the semiconductor memory device.

During a read operation of the semiconductor memory device, a write enable signal WE of a prescribed high level Vih is applied to the input buffer 11, as shown in the latter portion of FIG. 2C, such that a high level signal is provided by the inverter I1 to the write timing generator 12. As a result, the operation of the write timing generator 12 is stopped, and a write signal W is not generated.

At this time, the row and column address strobe signals RAS and CAS, as shown in FIGS. 2A and 2B, together with the output enable signal OE are applied to the read timing generator 13 to generate the chip enable signal CE, which is logically NANDed with the respective data D and /D by the NAND gates ND1 and ND2. The outputs from the NAND gates ND1 and ND2 passes through the respective inverters I2 and I3. The outputs of the inverters I2 and I3 are applied to the respective gate of a pair of NMOS transistors NM2 and MN3, which are serially connected to each other between a supply potential Vcc and a ground potential Vss. As a result, the output buffer 14 outputs a logic data signal DQi corresponding to the data D.

The ground voltage Vss of the semiconductor memory device is applied via a lead frame, which is connected through a bonding wire to an external ground terminal GND. A coil L in FIG. 1 denotes a parasitic inductance generated by the bonding wire and the lead frame. More importantly, when the level of the output data DQi transits from high to low during a read operation, a large amount of current flows quickly through the pull-down NMOS transistor NM3 of the output buffer 14 to the ground terminal Vss. As a result, the ground voltage Vss bounces due to the inductance coil L, as shown in FIG. 2E.

Therefore, the effective signal level of the input buffer 11, which should maintain a high level Vih for a read operation, is disrupted to dip down below the threshold voltage Vth, and the write enable signal WE transits to a low level for an interim period. The write timing generator 12 performs an inadvertent write operation, thereby resulting in a modification of a memory cell data and causing an operational error.

The above-described write/read control circuit of the conventional semiconductor memory device has various disadvantages. For example, when the output data level transits from a high to a low level during a read operation (FIG. 2E), a large current instantaneously flow through the pull-down NMOS transistor to the ground terminal such that the ground voltage bounces. Accordingly, the write enable signal WE may be erroneously recognized as a low level, thereby leading to a write operation of the memory device and generating an operational error.

To prevent the error in operation, the output terminal of the input buffer 11 is provided with a filter 15, composed of a NAND gate ND3 and a delay unit D having an odd number of inverters therein for blocking short transient signals, as shown in FIG. 3. An erroneous write enable signal caused by the bouncing of the ground voltage is eliminated. However, the filter 15 delays the normal write operation by the delay time period of the filter.

SUMMARY OF THE INVENTION

It is an object of the present invention to solve the problems of the related art and prior art.

An object of the present invention is to provide a circuit for a semiconductor memory device capable of preventing an inadvertent write operation.

Another object of the present invention is to prevent a delay during the write/read operation.

The present invention may be achieved in part or in whole by a read/write control circuit for a semiconductor memory device, comprising: an input buffer for comparing an externally applied write enable signal to a preset effective signal level; an inverter for inverting an output signal from the input buffer; a write timing generator for outputting a write signal in accordance with an output signal from the inverter; a read timing generator for generating a read timing signal in accordance with row and column address strobe signals, and outputting the generated read timing signal as a chip enable signal; an output buffer for externally outputting data applied thereto from the semiconductor memory device in accordance with the chip enable signal; and a write error preventive circuit for outputting a disable signal to disable the input buffer during a read operation of the semiconductor memory device.

The present invention may also be achieved in part or in whole by control a circuit for reading and writing of data in a memory device, comprising means for generating a write enable signal to the memory during a writing operation; means for outputting data from the memory device during a reading operation; and means, coupled to the data outputting means, for disabling the write enable signal generating means during the reading operation of the memory device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A through 5K are timing diagrams of the circuit of FIG. 4; and

DETAILED DESCRIPTION OF PREFERRED EMBODIMENTS

Figure 1:
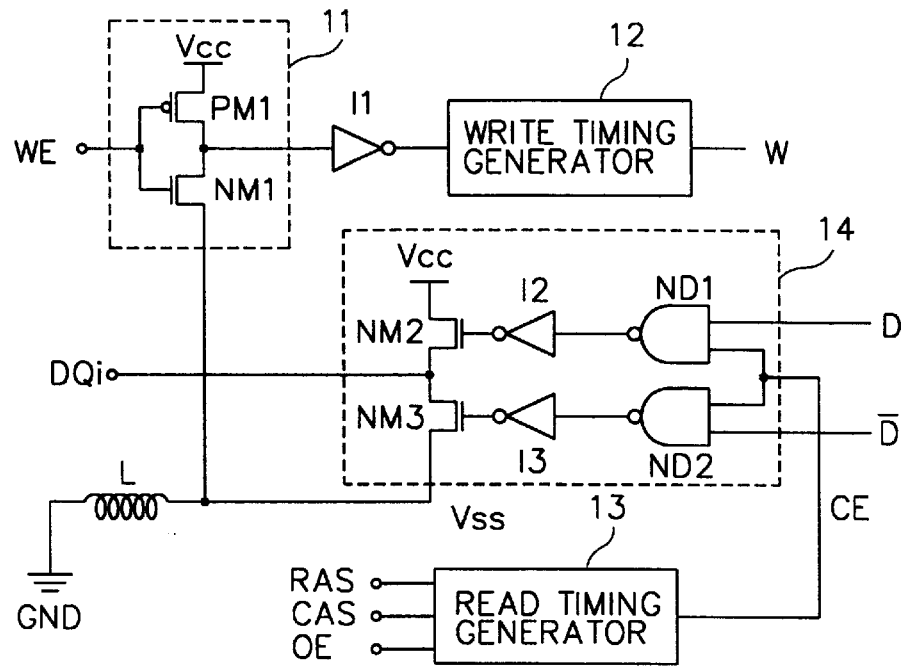
FIG. 1 is a block diagram of a conventional read/write control circuit of a semiconductor memory device.
Figure 2A:
FIGS. 2A through 2F are timing diagrams of the circuit of FIG. 1.
Figure 2B:
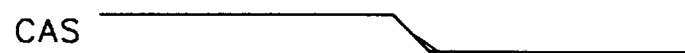
Figure 2C:
Figure 2D:
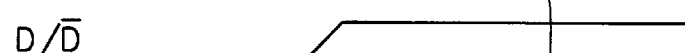
Figure 2E:
Figure 2F:
Figure 3:
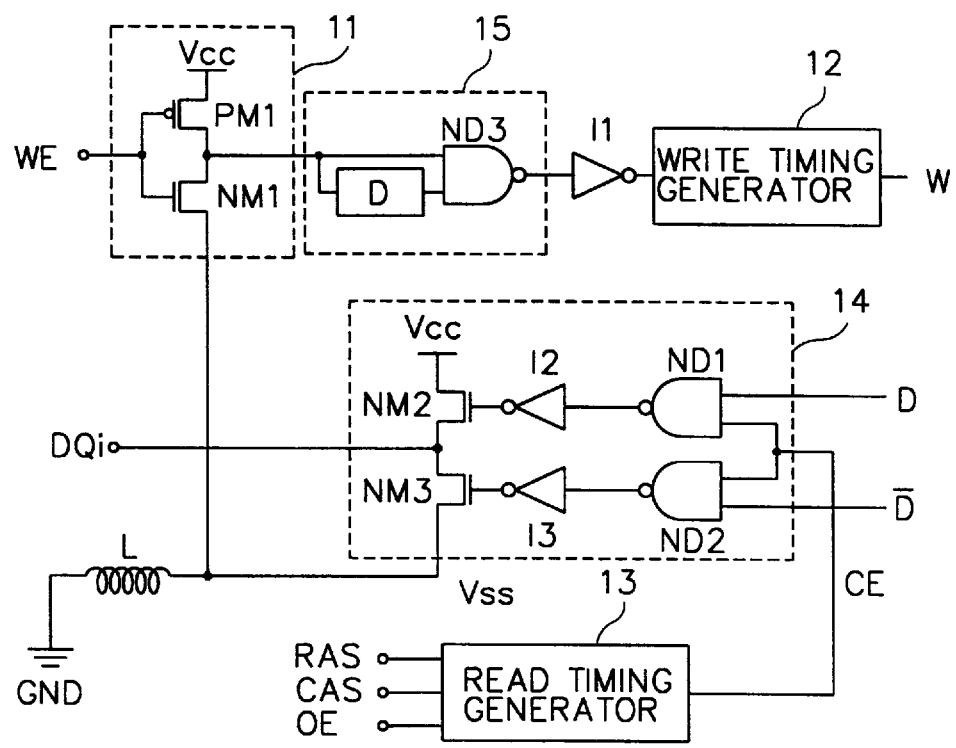
FIG. 3 is a block diagram of another conventional read/write control circuit of the semiconductor memory device.
Figure 4:
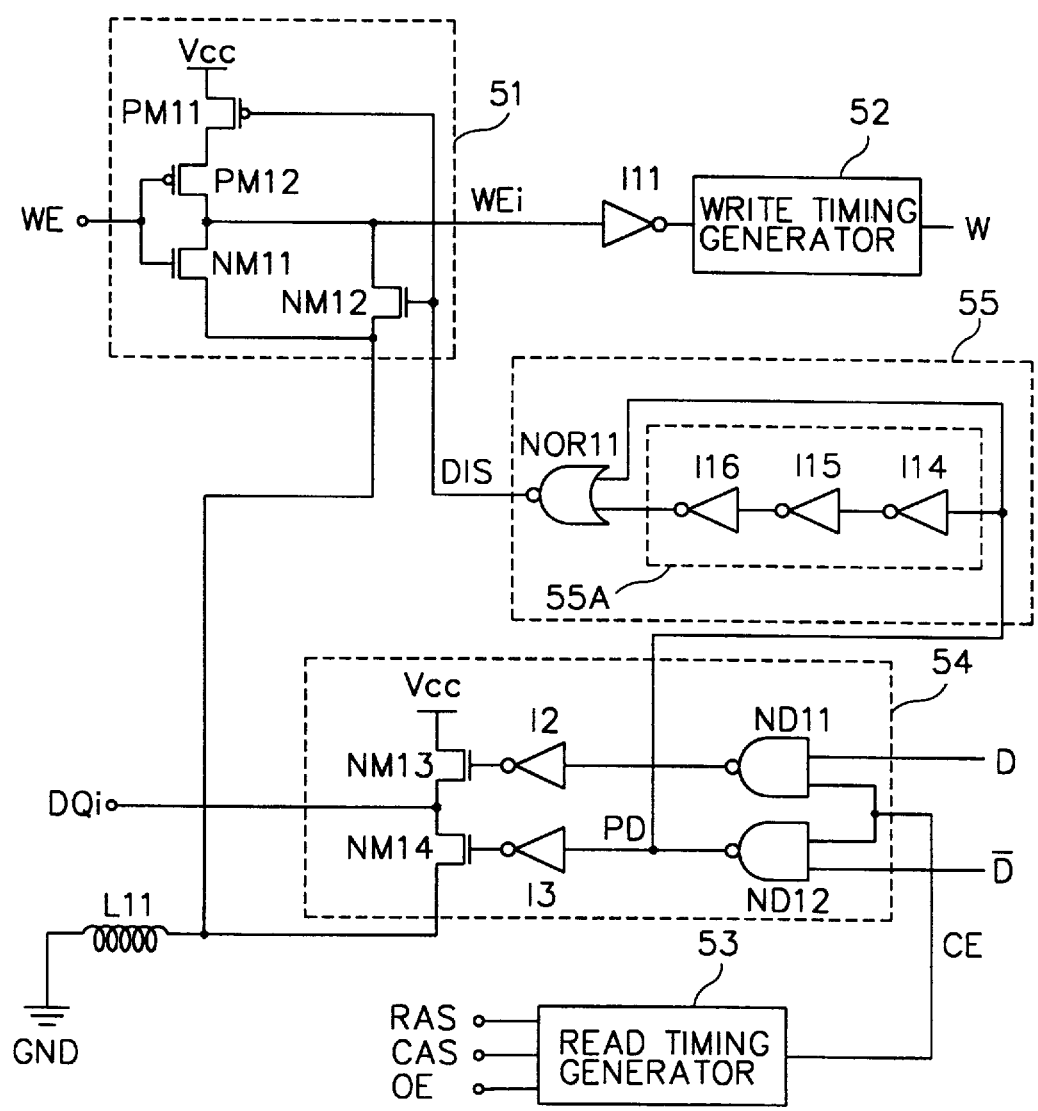
FIG. 4 is a block diagram of a write error preventing circuit in accordance with a first embodiment of the present invention.

FIG. 4 is a write error preventing circuit in accordance with a first embodiment of the present invention. An input buffer 51 compares an externally applied write enable signal WE to an effective level signal which is preset therein. An inverter I11 inverts an output signal WEi from the input buffer 51, and a write timing generator 52 outputs a write signal W in accordance with the output from the inverter I11. A read timing generator 53 generates a read timing signal in accordance with row and column address strobe signals RAS and CAS, and outputs the generated read timing signal as a chip enable signal CE. An output buffer 54 externally outputs data D and /D applied thereto from a memory device in accordance with the chip enable signal CE. A write error preventive circuit 55 outputs a disable signal DIS to the output buffer 51 during an interval of time the ground voltage Vss bounces, in accordance with an internal output signal PD from a NAND gate ND12 of the output buffer 54.

During a write operation, the disable signal DIS outputted from the write error preventive circuit 55 remains at an inactive low level, as shown in the beginning portion of the waveform of FIG. 5. The PMOS and NMOS transistors PM11 and NM12 are, respectively, turned on and off, whereby the input buffer 51 operates normally.

When a write enable signal WE of a low level Vil is applied to the input buffer 51, as shown in the beginning portion of the waveform of FIG. 5C, the PMOS transistor PM12 of the input buffer 11 is turned on, and the NMOS transistor NM11 is turned off. As a result, the input buffer 51 outputs a high signal which is inverted to a low signal by the inverter I11, and the low signal is applied to the write timing generator 52. Accordingly, the write timing generator 52 outputs a write signal W, which is transmitted to the internal memory circuit (not shown) such that data is written in the semiconductor memory device.

During a read operation of the memory device, the write enable signal WE is externally applied to the input buffer 51 at a certain high level Vih, as shown in the latter portion of the waveform of FIG. 5C. Accordingly, a high signal is applied to the write timing generator 52 to stop the operation thereof and no write signal W is generated.

At this time, the row and column address strobe signals RAS and CAS, as shown in FIGS. 5A and 5B, together with the output enable signal OE are applied to the read timing generator 53, which generates the chip enable signal CE. The chip enable signal CE is logically NANDed with the data D, /D, as shown in FIG. 5D, by NAND gates ND11 and ND12. The outputs from each of the NAND gates ND11 and ND12 passes, respectively, through inverters I12 and I13 and are applied to the respective gates of a pair of NMOS transistors NM13 and MN14 serially connected to each other between a supply potential Vcc and a ground potential Vss. As a result, the output buffer 54 outputs a logical data signal DQi corresponding to the input data D.

The input data D is applied to the output buffer 54 at a low level, and the inverted input data /D is applied thereto at a high level, so that the output signal PD from the NAND gate ND12 remains at a low level, as shown in FIG. 5E. The signal PD of a low level is inverted to a high level by the inverter I13. The high level signal from the inverter I13 turns on the NMOS transistor NM14, thereby outputting the data DQi at a low level, as shown in FIG. 5F.

When the level of the output data DQi from the output buffer 54 transits from high to low, the turn-on operation of the NMOS transistor NM14 may cause a large current to flow through the NMOS transistor NM14, causing the ground voltage Vss, as shown in FIG. 5G, to bounce due to a parasitic inductance L11. However, an erroneous operation of the write timing generator 52 does not occur due to the write error preventive circuit 55 in accordance with the present invention.

The internal output signal PD from the NAND gate ND12, as shown in FIG. 5E, is applied to a first input of a NOR gate NOR11 and to the input of a delay unit 55A composed of series inverters I14–I16. The output of the relay unit 55A is also connected to a second input of the NOR gate NOR1. When the data DQi is outputted at a low level, a low signal is applied to the first input of the NOR gate NOR11 and a high signal is applied to the second input of the NOR gate NOR11, via the delay unit 55A to which the high internal signal PD is applied. The inputs are logically NORed by the NOR gate NOR11, and a disable signal DIS is output at an active high level, as shown in FIG. 5H.

In response, the PMOS transistor PM11 of the input buffer 51 is turned off, and accordingly, the supply voltage Vcc is cut off. Even the effective input level of the input buffer 51 is lowered below the threshold voltage Vth, as shown in FIG. 5I, when the ground voltage Vss bounces, the output signal of the input buffer 51 remains at a ground voltage level Vss, as shown in FIG. 5J to prevent the erroneous operation of the write timing generator 52.

When the bouncing of the ground voltage Vss due to the inductance L11 terminates, the delay unit 55A outputs a high signal, so that the disable signal DIS outputted from the NOR gate NOR11 transits to low, as shown in FIG. 5H, thereby allowing normal operation of the input buffer 51. Consequently, during an interval where the ground voltage bounces, the disable signal DIS, as shown in FIG. 5H, is generated through the write error preventive circuit 55, thereby disabling the input buffer 51. As a result, a read operation error caused by the bouncing of the ground voltage Vss can be prevented.

Figure 6:
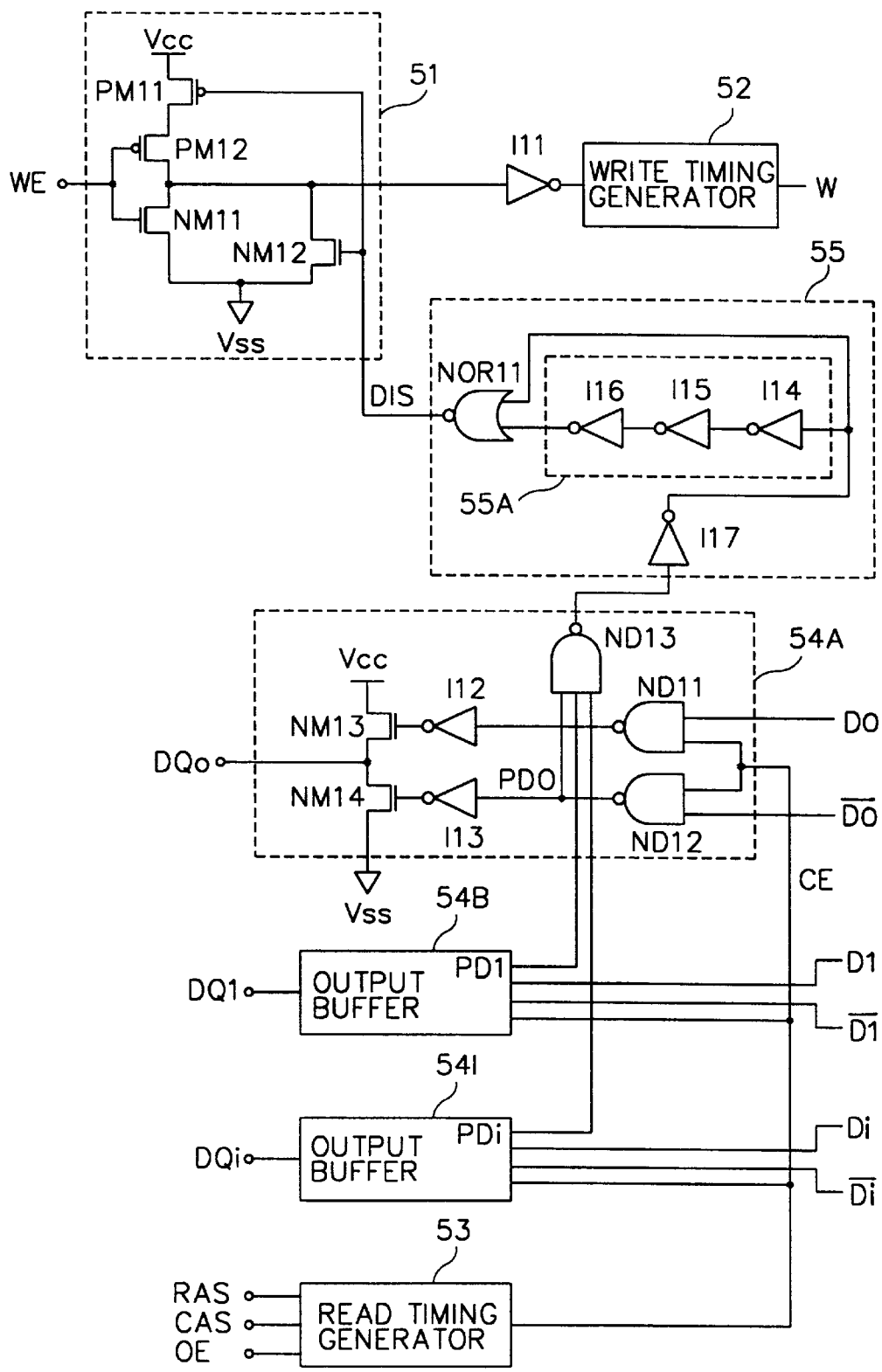
FIG. 6 is a block diagram of a write error preventing circuit in accordance with a second embodiment of the present invention.

FIG. 6 illustrates a second embodiment of the present invention. A plurality of output buffers 54A–54I generates multiple internal signals PO-Pi which are applied through the NAND gate ND13 and an inverter I17 to the write error preventive circuit 55. Such circuitry has the same effect as in the first embodiment.

The write error preventing circuit of the present invention prevents the occurrence of a write error due to the bouncing of the ground voltage. The input buffer is disabled using an internal output signal of the output buffer during an interval where the ground voltage bounces during a reading operation of a memory device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A read/write control circuit for a semiconductor memory device, comprising:

an input buffer for comparing an externally applied write enable signal to a preset effective signal level;

an inverter for inverting an output signal from the input buffer;

a write timing generator for outputting a write signal in accordance with an output signal from the inverter;

a read timing generator for generating a read timing signal in accordance with row and column address strobe signals, and outputting the generated read timing signal as a chip enable signal;

an output buffer for externally outputting data applied thereto from the semiconductor memory device in accordance with the chip enable signal; and a write error preventive circuit for outputting a disable signal to the input buffer during a time interval where a ground voltage bounces in accordance with an internal output signal from the output buffer to disable the input buffer during a reading operation of the semiconductor memory device.

2. The read/write control circuit of claim 1, wherein in the input buffer a supply voltage passes through a first PMOS transistor and a serially connected second PMOS transistor and first NMOS transistor to ground, the first NMOS transistor being parallel connected to a second NMOS transistor, and a disable terminal from the write error preventive circuit being connected to gates of each of the first PMOS transistor and the second NMOS transistor.

3. The read/write control circuit of claim 1, wherein in the write error preventive circuit includes a NOR gate and a delay unit, an internal output signal from the output buffer being applied to one input of the NOR gate and to an input of the delay unit, an output from the delay unit being applied to another input of the NOR gate, and the output terminal of the NOR gate is connected to a disable terminal of the input buffer.

4. The read/write control circuit of claim 3, wherein the delay unit includes a plurality of serially connected inverters.

5. The read/write circuit of claim 3, wherein multiple output buffers are provided therein and an internal output terminal of each of the multiple output buffers is connected through a NAND gate and an inverter to the input of the delay unit and to the one input of the NOR gate of the write error preventive circuit.

6. A control circuit for reading and writing of data in a memory device, comprising:

means for generating a write enable signal to the memory during a writing operation;

means for outputting data from the memory device during a reading operation; and means, coupled to said data outputting means, for disabling said write enable signal generating means during the reading operation of the memory device.

7. The control circuit of claim 6, wherein said write-enable signal generating means includes a first buffer having first, second and third transistors coupled in series between a first potential and a second potential, and a fourth transistor coupled in parallel with said third transistor, and said first transistor being coupled to said disabling means to prevent an application of the first potential to the second transistor during the read operation.

8. The control circuit of claim 7, wherein each of said first, second, third and fourth transistors includes first and second electrodes and a control electrode, the control electrodes of said second and third transistors being coupled to one another to receive a write enable signal, and the control electrodes of said first and fourth transistors being coupled to one another to receive an output signal from said disabling means.

9. The control circuit of claim 8, wherein said first and second transistors are PMOS transistors and third and fourth transistors are NMOS transistors.

10. The control circuit of claim 7, wherein said write enable signal generating means further includes:

an inverter coupled to said third and fourth transistors; and a write timing generator coupled to an output of said inverter such that a write signal is generated for writing of the data into the memory device during the writing operation.

11. The control circuit of claim 6, wherein said outputting means includes at least one second buffer for receiving data from the memory device and outputting a first output signal corresponding to the data and a second output signal for controlling said disabling means such that said disabling means disables said write enable signal generating means during the reading operation.

12. The control circuit of claim 11, wherein said outputting means further includes a read timing generator coupled to said second buffer, said read timing signal generator generating a chip enable signal to enable said second buffer in response to a plurality of control signals during the read operation.

13. The control circuit of claim 12, wherein said second input buffer includes:

first and second logic gates having a common input terminal to receive the chip enabling signal, each having another input terminal to receive first and second data;

first and second inverters coupled to outputs of first and second logic gates, respectively; and fifth and sixth transistors, each having first and second electrodes and a control electrode, first electrodes of said fifth and sixth transistors being coupled to the first and second potentials, respectively, control electrodes of said fifth and sixth transistors being coupled to said first and second inverters, respectively, and first and second electrodes of the sixth and fifth transistors, respectively, coupled to each other at an output node for providing the first output signal, wherein an output of said second logic gate is the second output signal.

14. The control circuit of claim 13, wherein said first and second logic gates are NAND gates and said fifth and sixth transistors are NMOS transistors.

15. The control circuit of claim 6, wherein said disabling means comprises a delay unit and a third logic gate, each receiving an output signal from said data outputting means, said delay unit generating a delayed output signal to said third logic gate such that said third logic gate outputs a disabling signal to disable said write enable signal generating means during the read operation.

16. The control circuit of claim 15, wherein said delay unit comprises a plurality of inverters coupled in series.

17. The control circuit of claim 15, wherein said third logic gate is a NOR gate.

* * * * *